United States Patent [19]

Le et al.

[11] Patent Number: 5,038,308
[45] Date of Patent: Aug. 6, 1991

[54] COMPACT SYSTEM UNIT FOR PERSONAL COMPUTERS

[75] Inventors: Bao G. Le, Santa Ana; Frederick J. Nemec, Tustin, both of Calif.

[73] Assignee: AST Research, Inc., Irvine, Calif.

[21] Appl. No.: 232,714

[22] Filed: Aug. 16, 1988

[51] Int. Cl.$^5$ .............................................. G06F 15/20
[52] U.S. Cl. .................... 364/708; 364/900; 361/415
[58] Field of Search ............... 364/708, 200 MS File, 364/900 MS File; 361/380, 390, 395, 399, 415

[56] References Cited

U.S. PATENT DOCUMENTS

| | | | |
|---|---|---|---|
| 4,669,053 | 5/1987 | Krenz | 364/900 |
| 4,725,244 | 2/1988 | Chewning et al. | 439/296 |
| 4,769,764 | 9/1988 | Levanon | 364/708 |
| 4,862,327 | 8/1989 | Ansell et al. | 361/399 |

FOREIGN PATENT DOCUMENTS 2143117 2/1985 United Kingdom .

OTHER PUBLICATIONS

"Industrial Personal Computer for Class C Industrial Environment", IBM Technical Disclosure Bulletin, vol. 28, No. 7, Dec. 1985, pp. 2785-2798.

Primary Examiner—Dale M. Shaw
Assistant Examiner—Debra A. Chun
Attorney, Agent, or Firm—Knobbe, Martens, Olson & Bear

[57] ABSTRACT

A compact system unit for personal computers wherein system hardware components are closely integrated and packed resulting in an effective utilization of space. Such compact integration of hardware is facilitated by the arrangement of system hardware components co-planar with each other. The compact system unit incorporates a hard disk and a floppy disk. The floppy disk controller card is co-planar with and plugs directly on to the mother board. A bus expansion card is vertically mounted to the mother board whereby up to two additional optional expansion cards may be incorporated in a parallel formation within the compact system unit. The daughter board is directly mounted to the mother board in inverted orientation.

17 Claims, 4 Drawing Sheets

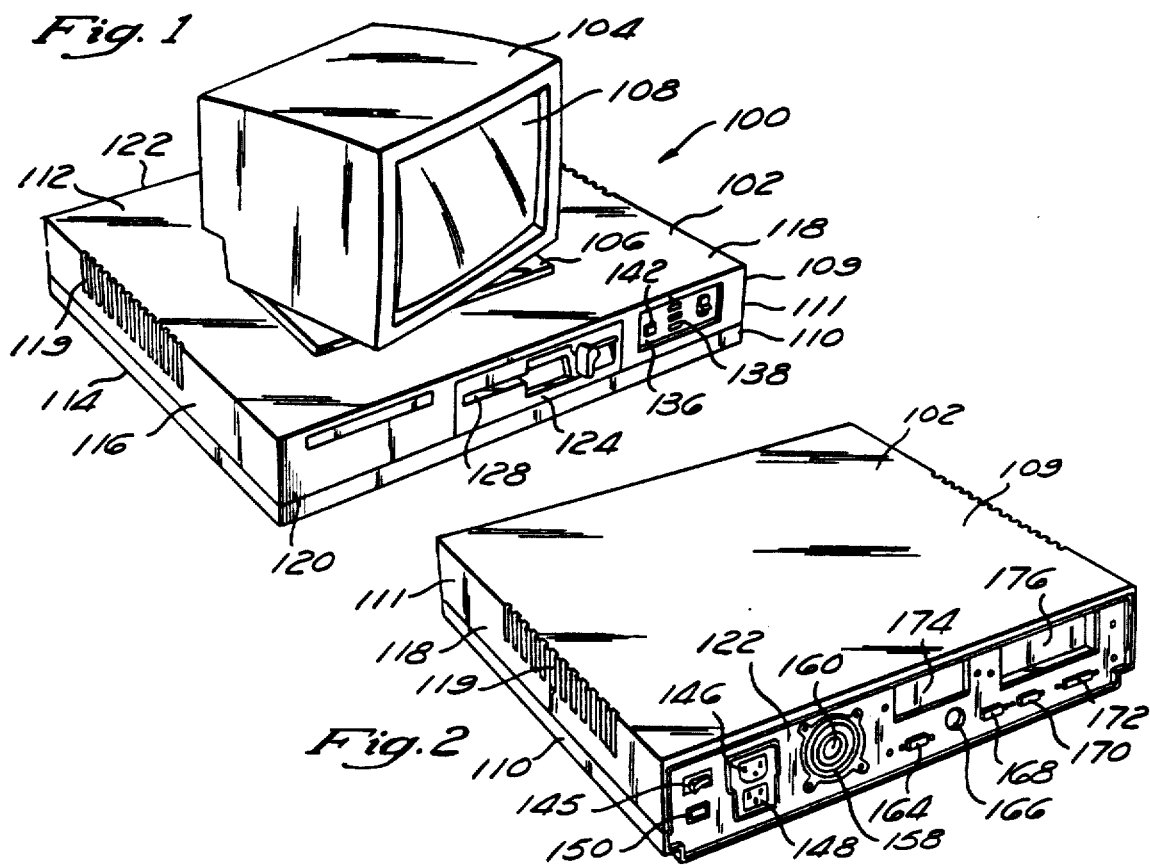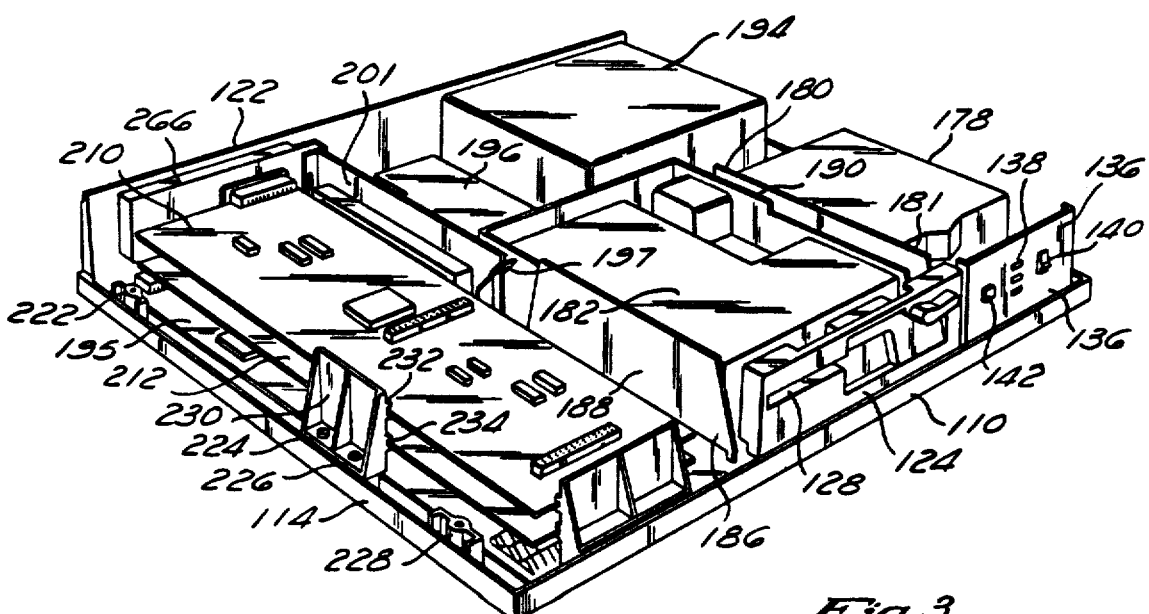

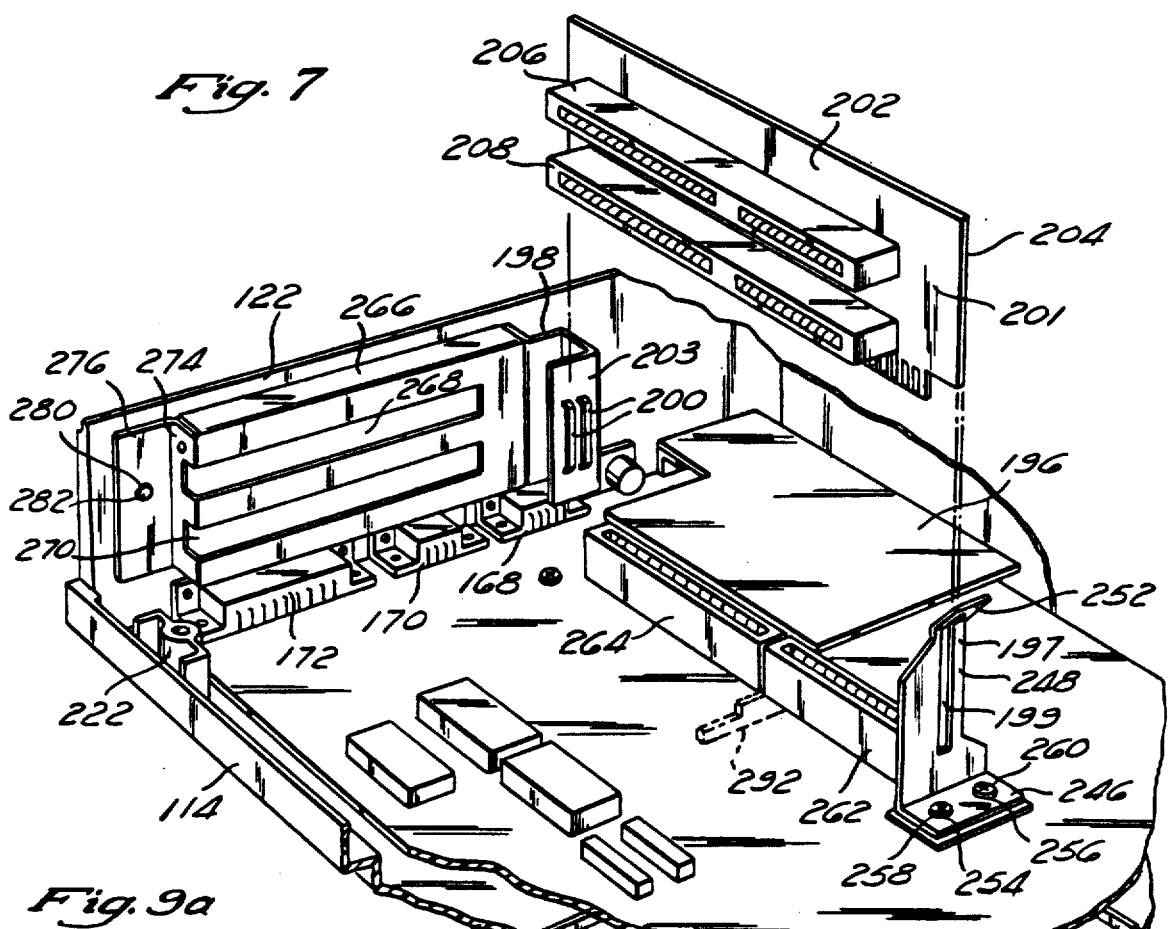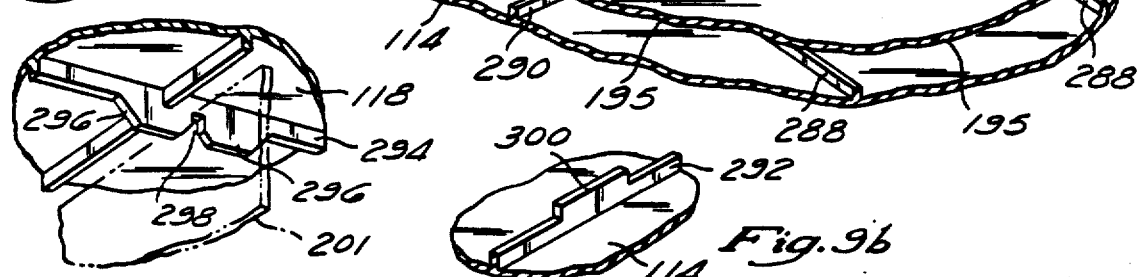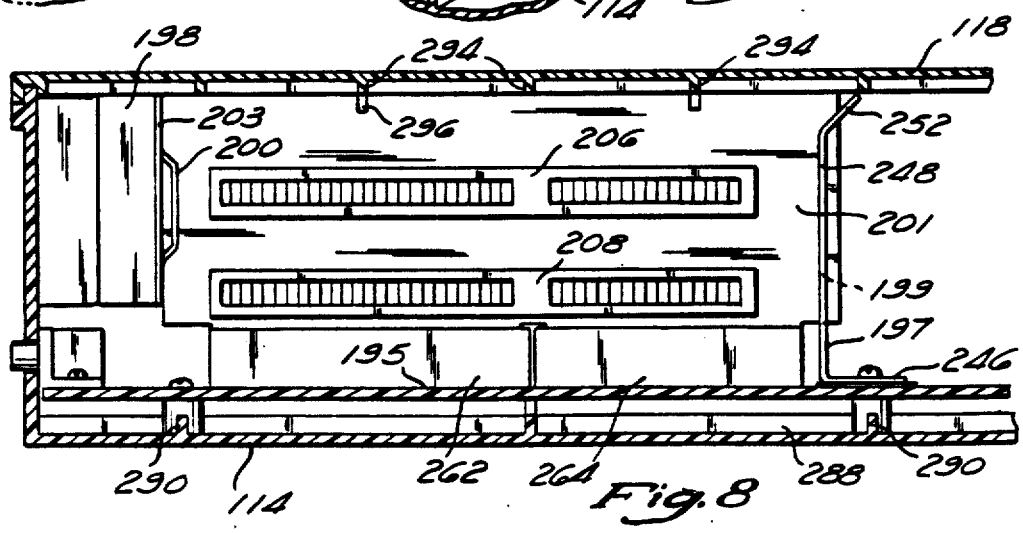

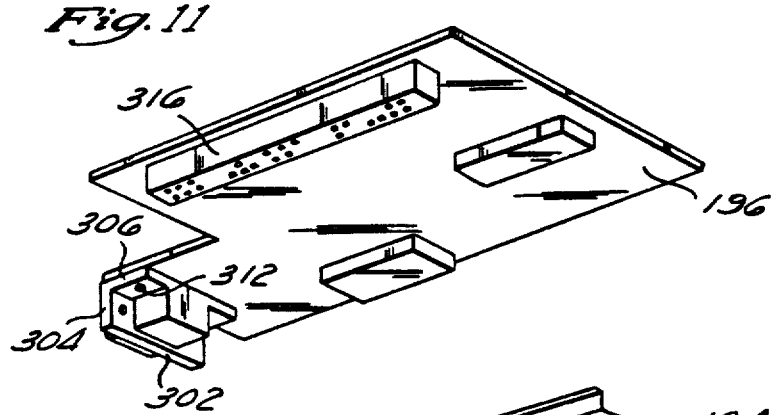
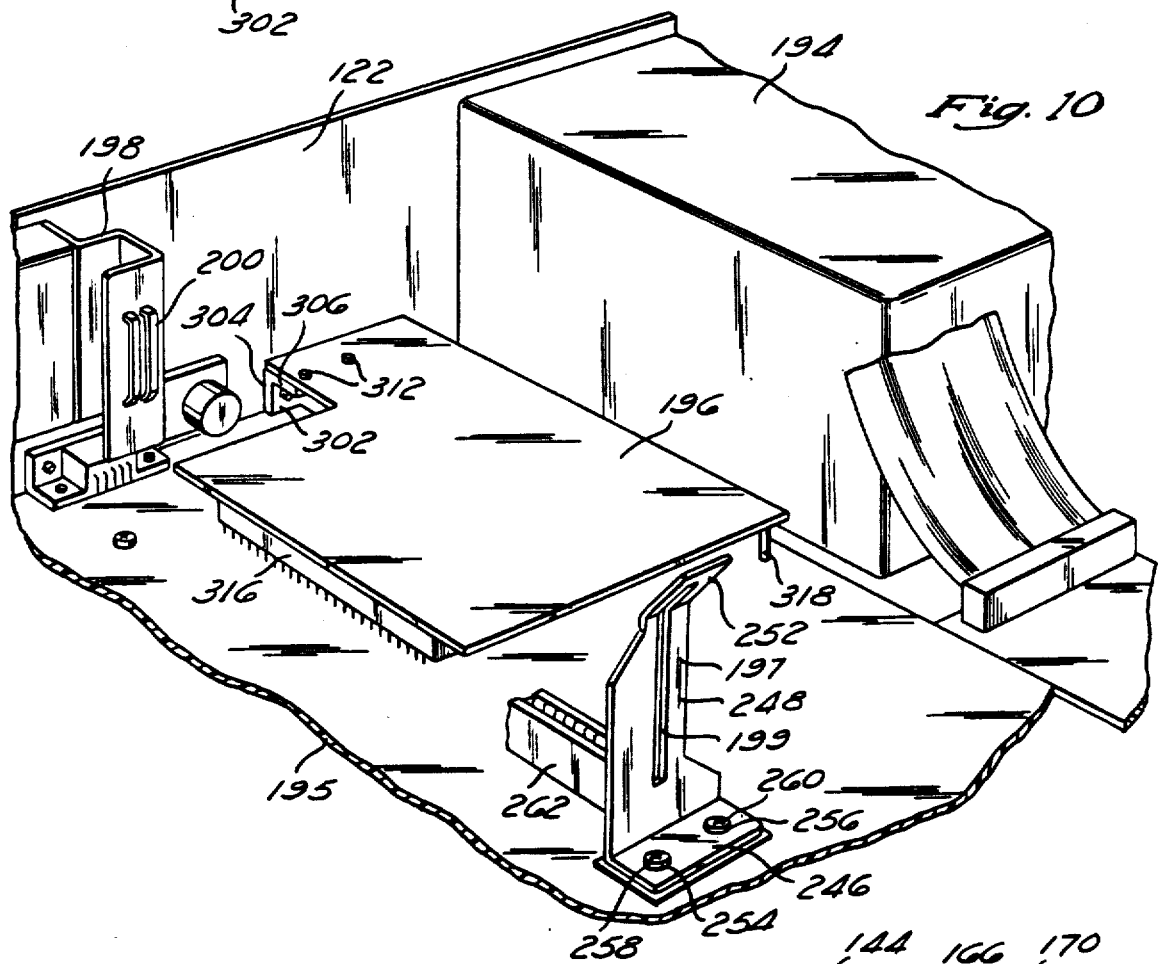
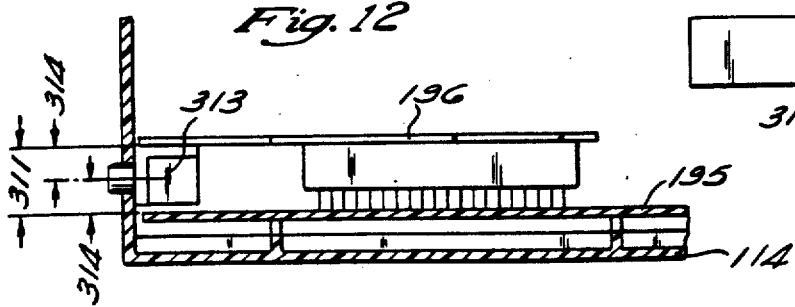

COMPACT SYSTEM UNIT FOR PERSONAL COMPUTERS

BACKGROUND OF THE INVENTION

1. Field of the Invention

The present invention relates generally to digital computer systems, more particularly to microprocessor based small and business computer systems and most particularly to a compact system unit for small and business computer systems utilizing a compact arrangement of the system hardware, wherein the system hardware components are closely and firmly integrated. The compact integration of system hardware thus facilitates the reduced size of the system unit.

2. Description of the Prior Art

Continuous and competitive endeavors to research innovative designs resulting in new and progressively advanced computer systems, with enhanced features offering increased performance and improved efficiency are of paramount importance in the computer industry. Enhanced computational capability in conjunction with progressively smaller system units have always been priority items in the computer industry. Efforts toward satisfying the continuing need for smaller and more compact computer systems have resulted in the advent of technology utilizing large and very large scale integration of hardware. Such technology allows for an increased density of components on circuit boards and the reduced size of components. Smaller computer systems are desirable in view of the fact that the reduction in size basically promotes and enhances user convenience by providing additional working space and increased portability. Computer systems incorporating compact integration of hardware also advantageously decrease manufacturing costs.

Many existing computer systems that offer comparable hardware are relatively bulky and cumbersome to move, especially computer systems that incorporate a hard disk and a floppy disk.

To compensate for the inconvenience and alleviate the problems associated with bulky computer systems and to reduce manufacturing costs the improved method of integration as disclosed in the present invention incorporates the system hardware components enumerated as follows: a hard disk, a floppy disk, a power supply, a mother board, two optional boards, a floppy controller card and an EGA monitor controller board. The above-listed hardware is enclosed within a compact enclosure having considerably reduced dimensions, preferably with an estimated width of 16.04", an estimated length of 14.79" and an estimated height of 3.29" (with rubber feet the height is 3.42").

SUMMARY OF THE INVENTION

The present invention is directed toward a compact system unit for small and business computer systems resulting from compact integration of system hardware. The compact system unit advantageously provides an increase in portability and desk top space thereby enhancing user convenience.

More specifically, the compact integration of system hardware results from an increased density of system units closely and firmly united and confined within a smaller space.

One feature facilitating such compact integration resides in the precise and structured arrangement of system hardware components whereby all the system hardware components are co-planar thereby advantageously utilizing all available space.

Another feature facilitating such compact integration exists in the effective utilization of space whereby the floppy controller card connects directly to the side of the mother board resulting in a co-planar arrangement.

Still another feature facilitating such a compact integration resides in the effective utilization of a bus expansion card which connects the optional expansion boards in parallel with the mother board. The bus expansion card is inserted vertically into connectors that are placed between two brackets, aligned along the same axis as the connectors, the brackets guiding the bus expansion card into the connectors and then holding it rigidly in place. An additional feature contributing to the stability of the bus expansion board is a modification in one of the horizontal ribs extending along the top of the system unit enclosure, positioned directly over the bus expansion card. The horizontal rib has two identical projections with a small opening in the center. The edge of the bus expansion card is received and held in this small opening to prevent deflection of the card.

Still another feature resides in the method of mounting a daughter board to the mother board in an effective way utilizing a minimum amount of space. Specifically, the daughter board is inverted and mounted directly to the mother board in a position which allows, alternatively, connectors on the mother board or the daughter board to fit through the same opening in an exterior panel of the system.

The above-stated improvements permit the integration of system hardware components in an effective and efficient way thereby providing a relatively compact system unit that incorporates a floppy disk drive and a hard drive with reduced dimensions. This configuration provides increased portability and reduced manufacturing costs. The compact system unit has a width of 16.04", a length of 14.79" and a height of 3.29" (with the rubber feet the height is 3.42").

BRIEF DESCRIPTION OF THE DRAWINGS

The preferred embodiment of the invention is illustrated in and by the following drawings in which like reference numerals indicate like parts and in which:

FIG. 1 is a perspective view of a digital computer system illustrating a video display monitor and a compact system unit in accordance with the present invention.

FIG. 2. is a perspective view showing the rear of the unit of FIG. 1.

FIG. 3 is a perspective view of the compact system unit of FIG. 1 with the upper cover removed to illustrate the compact arrangement of system hardware within.

FIG. 7 is a partial perspective view illustrating a bus expansion card mounted vertically to a mother board.

FIG. 8 is a cross sectional view of the bus expansion card of FIG. 7 mounted to a mother board.

FIG. 9a is a detailed perspective view illustrating a rib extending from the inside of the cover of the computer system and designed to keep an expansion bus card from deflecting.

FIG. 9b is a detailed view illustrating a rib extending from the inside of the base of the computer system and designed to support a mother board and prevent board deflection.

FIG. 10 is a partial perspective view illustrating a daughter board inverted over a mother board.

FIG. 11 is a perspective view illustrating an inverted daughter board.

FIG. 12 is a cross sectional view illustrating a daughter board inverted and mounted to a mother board.

FIG. 13 is an elevation view illustrating the rear of the system unit.

DETAILED DESCRIPTION OF THE PREFERRED EMBODIMENT

Figure 4:
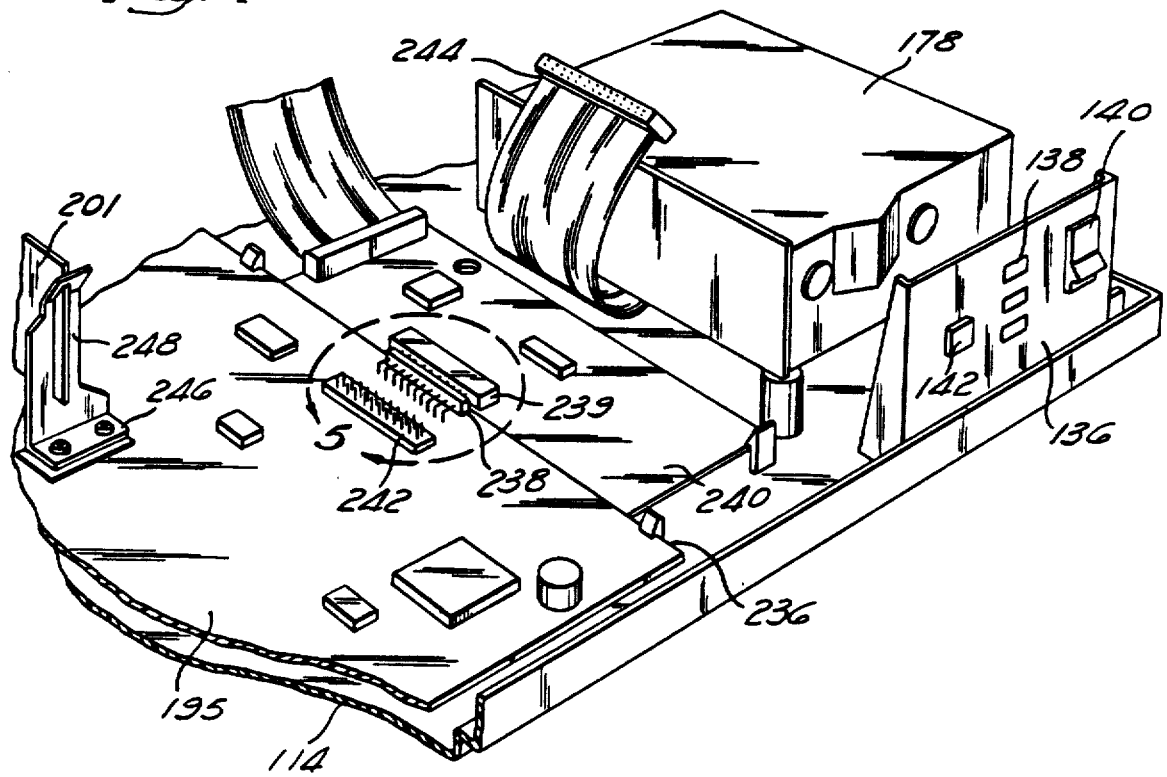
FIG. 4 is a perspective view, partially cut away, illustrating a floppy controller card connected directly to a mother board whereby the mother board and floppy controller card are co-planar.

Referring now to the drawings, FIG. 1 illustrates generally a digital computer 100 with a new and improved compact system unit 102 as disclosed in the present invention. Typically, the digital computer 100 comprises a video display monitor 104 having a flat base 106 and a CRT screen 108, the flat base 106 supporting the video monitor 104 on a generally flat support surface such as the compact system unit 102. Further, the flat base 106 is of sufficient area to enable the video monitor 104 to be stable when placed on the compact system unit 102.

The compact system unit 102 is housed within an enclosure 109. The enclosure 109 comprises two sections 110 and 111, wherein section 110 constitutes a lower section and section 111 constitutes an upper, larger section. Both the sections 110 and 111 are engaged to form the compact enclosure 109. The compact system unit 102 encased within the enclosure 109, further comprises an upper wall 112 and an opposing bottom wall 114. The flat base 106 of the video monitor 104 is supported on the upper wall 112. The compact system unit 102 further comprises identical opposing side walls 116 and 118, a front wall 120 and a rear wall 122. Horizontally centered along the opposing side walls 116 and 118, toward the upper end, are a plurality of elongate, rectangular slots 119 which are vertically aligned parallel to each other and are provided for ventilation purposes. Located toward the center of the front wall 120 is a diskette drive 124 including a narrow opening 128 through which a diskette (not shown) may be inserted. Located toward the right side of the front wall 120 is a panel 136, providing three indicator lights 138 oriented one below the other along a vertical axis, a key lock switch 140 and a reset button 142. The indicator lights 138 indicate the machine speed (10 MHz or 6 Mhz) and hard disk activity.

FIG. 2 illustrates the rear wall 122 having a rear system unit panel 144. Located on the extreme upper left corner of the rear system unit panel 144 is a power switch 145 and adjacently aligned with the power switch 145 is a 3-pin power socket outlet 146. Directly below the 3-pin socket 146 is a power inlet connector 148 and adjacent to the 3-pin socket and directly below the power switch 145 is an input voltage select switch 150. A cooling fan frame 158 covers a cooling fan 160 which is attached to the rear panel of the power supply 194 by screws 162, as best seen in FIG. 3. Located proximate the cooling fan 158, toward the lower end of the rear system unit panel 144 are a video port 164 and a circular keyboard connection port 166.

Proximate the keyboard connection port 166 are located three horizontally aligned ports: a serial 1 port 168, a serial 2 port 170 and a parallel port 172. Above the video port 164 and the keyboard connection port 166 is provided a large rectangular opening 174 used for expansion purposes. Horizontally aligned with the large rectangular opening 174 is a relatively larger rectangular opening 176; provided for I/O purposes.

FIG. 3 illustrates the system hardware components compactly integrated in a co-planar arrangement within the system unit 102 consistent with the preferred embodiment of the present invention. The system unit 102 as illustrated in FIG. 3 comprises a hard disk 178 placed directly behind the panel 136 on the front wall 120. The hard disk 178 is mounted within an individual housing 180 having a left wall 181, which serves as a partition as well as supports the upper wall 112.

The system unit 102 further comprises a floppy disk drive 182 which is mounted within an individual housing 186 having a left wall 188 and a right wall 190 which are parallel and horizontally aligned with the left wall 181 of the housing 180. The left wall 188 and the right wall 190 likewise serve as supports for the upper wall 112. Each of the housings 180 and 186 is mounted onto the lower section 110 by snapping into circular bosses.

The system unit 102 also comprises a power supply 194 which is mounted in the extreme right corner of the rear wall 122, behind the hard disk 178. Additionally, the system unit also comprises a mother board 195, placed adjacent to the power supply 194 and extending along the entire length of the system unit 102. Mounted directly behind the floppy disk drive 182 is a daughter board 196. The daughter board 196, in this case, is an EGA monitor controller board. The daughter board 196 is mounted directly to the mother board 195 in an inverted orientation. Mounted adjacent to the daughter board 196 are two brackets, a front bracket 197 and a rear bracket 198. These brackets 197,198 are directly mounted to the bottom wall 114 through the mother board 195. The front bracket 197 includes a narrow slot 199 extending along most of the length of the bracket 197, for supporting the bus expansion card 201 in place. The rear bracket 198 is S-shaped and has a front end 203 which includes two projections 200 (as best shown in FIG. 8) for guiding and supporting the other end of the bus expansion card 201.

As best shown in FIGS. 3 and 7, the bus expansion card 201 has a front side 202 and a rear side 204. The front side of the bus expansion card 202 has two horizontally extending parallel connectors 206 and 208 which are placed proximate each other and are vertically aligned. The connectors 206 and 208 establish a direct electrical connection with two optional expansion boards 210 and 212 (shown in FIG. 3) which are placed in stack formation in planes parallel to the plane of the mother board 195 and directly above one another. The optional expansion boards 210 and 212 are further vertically aligned with the mother board 195.

At the extreme rear left corner of the system unit 102 is a mounting boss 222 projecting up from the bottom wall 114. Further along the side wall 116 are two additional mounting bosses 224 and 226 (shown in FIG. 3), which are located side-by-side. Toward the front end of the side wall 116 is another mounting boss 228. Each of the above-mentioned mounting bosses 222, 224, 226 and 228 and an identical set of bosses along the opposite side wall 118, have a threaded interior to accommodate screws which hold the upper case portion 111 to the lower portion 110.

Mounted to the mounting bosses 224 and 226 is a holding bracket 230 which has two pairs of slim projections 232 and 234, extending along the entire width of the holding bracket 230. These projections form grooves which mount the edge of the optional expansion boards 210 and 212.

Figure 5:
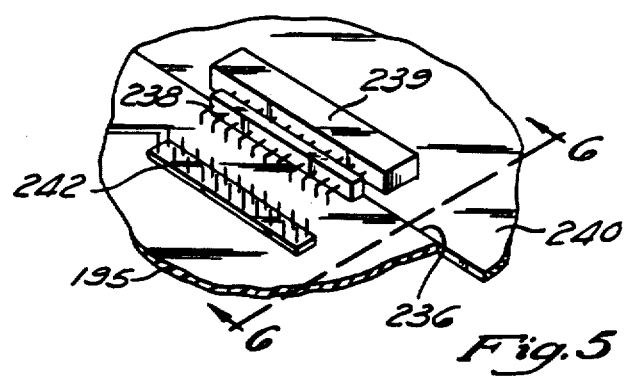
FIG. 5 is an enlarged view illustrating a connector used for the co-planar arrangement of a floppy controller card and a mother board.
Figure 6:
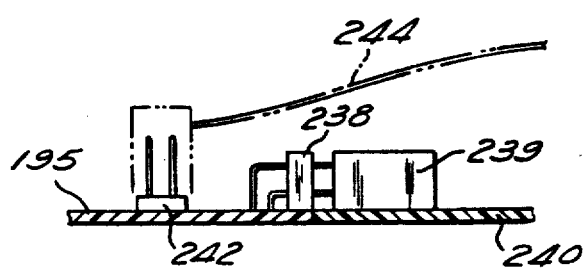
FIG. 6 is a sectional view, taken along the line 6-6 in FIG. 5.

Referring now to FIGS. 4, 5 and 6, the mother board 195 has a right edge 236. Adjacent the right edge 236, the upper surface of the mother board mounts a right angle wafer connector 238. A floppy drive connector 239 connects directly to the right angle wafer connector 238, and is attached rigidly to a floppy controller card 240. The floppy controller card 240 thus plugs directly to the right edge 236 of the mother board 195 without an intervening cable. The floppy controller card 240 and the mother board 195 are co-planar to reduce the vertical profile of the system. Positioned proximate to the right angle wafer connector 238 on the mother board 195 is a hard disk connector 242. A hard disk signal cable 244 plugs into the hard disk connector 242.

As shown in FIGS. 7 and 8, the expansion bus card 201 slides between the projections 200 that protrude from the front end of the rear bracket 198 and the slot 199 extending vertically down the front bracket 197. The front bracket 197 includes a base section 246 extending parallel to the mother board 195 and a vertical section 248 extending perpendicular to the base section 246. The vertical section 248 of the front bracket 196 has a top end 252 which projects at a 45 degree angle from the vertical. The base section 246 of the front bracket 197 further includes two apertures 254 and 256 for receiving screws 258 and 260 which securely mount the front bracket 196 through the mother board 195 to the bottom wall 114 of the system. This allows the expansion boards to be mounted to the card 201, directly above the mother board 195, without a support which spans between the side walls of the system. Thus, the card 201 can be supported through the mother board 195, not around it. The expansion bus card 201 connects directly into two expansion connectors 262 and 264 placed end-to-end on the mother board 195. The two expansion connectors 262 and 264 are centered along the same longitudinal axis as the front bracket 197 and the rear bracket 198.

Adjacent to the rear bracket 198 and mounted to the extreme left end of the rear wall 122 is a frame bracket 266 having two horizontal openings 268 and 270 extending along its width which are oriented vertically one above the other to enable the optional boards 210 and 212 to be mounted. A left end 274 of the frame bracket 266 has a flat extended portion 276 having an aperture 278 that is aligned with a similar aperture 280 in the rear wall 122. Through the aligned apertures 278 and 280 is received a screw 282 which mounts the frame bracket 266 to the rear wall 122. Directly below the frame bracket 266 toward the extreme left corner of the rear wall 122 is the parallel port 172. Adjacent to the parallel port 172 and also below the frame bracket 266 is the serial port 2 170 and adjacent to the serial port 2 170 is the serial port 1 168. FIG. 7 further illustrates the bottom wall 114 of the system unit 102 having latitudinal ribs 288 and lateral ribs 290 extending in orthogonal directions. The ribs 288 and 290 support the various system components and prevent deflection. A rib 292 (shown in phantom) extending laterally is located directly below the two expansion connectors 262 and 264 to provide support when pressure is applied to plug the bus expansion card 201 into the bus connectors 262 and 264.

FIG. 8 further illustrates the manner in which the bus expansion card 201 is securely mounted through the mother board 195 to the bottom wall 114. The bus expansion card 201 is cradled within the slot 199 extending along the front bracket 197 and the projections 200 extending outward from the rear bracket 198. The bus expansion card is electrically connected to the mother board 195 via the two adjacent bus connectors 262 and 264.

FIGS. 9a and 9b illustrate the ribs extending above and below the bus expansion cards, respectively. FIG. 9a shows the laterally extending rib 294 having two portions 296 that project downward from the upper wall 112 of the system enclosure, on either side of a small opening 298. When the bus expansion card 201 is mounted to the mother board 195 the two portions 296 of the rib 294 receive the bus expansion card 201 within the opening 298 and thereby provide rigid support to the bus expansion card 201. FIG. 9b shows the laterally extending rib 292 which extends upwardly from the bottom wall 114, having a projecting portion 300. The projecting portion 300 is provided to support the mother board 195 and prevent the mother board from deflecting when pressure is applied to the bus expansion board 201 during the process of inserting the bus expansion card 201 into the bus expansion connectors 262 and 264.

FIGS. 10 and 11 illustrate the daughter board 196 mounted to the mother board 195. The daughter board 196 includes an L-shaped mounting bracket 302 having a vertical section 304 and a horizontal section 306. The horizontal section 306 of the mounting bracket 302 is attached to the daughter board 196 by screws 312 that pass through the daughter board 196. The vertical section 304 is similarly attached to the rear wall 122 of the system unit 102. Along the left side of the daughter board 196 extends a connector 316 that electrically connects directly to the mother board 195. The daughter board 196 is further mounted to the mother board 195 by a standoff 318.

FIG. 12 shows a side view of the daughter board 196 mounted to the mother board 195 in an inverted orientation. By spacing the daughter board 196 a distance 311 above the mother board 195, which is twice the offset 314 of port connectors 313, a port connector 313 mounted on either the daughter board 196 or the mother board 195 may exit the rear wall 122 through the same opening.

FIG. 13 illustrates the rear system unit panel 144 of the compact system unit 102 showing the video port 164, the serial 1 port 168, the serial 2 port 170 and parallel port 172 horizontally aligned along the same longitudinal axis. The keyboard connection port 166 is offset from the longitudinal axis.

What is claimed is:

1. A compact computer system unit having a reduced vertical profile, comprising:
   system hardware integrated in a compact arrangement, comprising:
   a hard disk drive that stores data;
   a floppy disk drive that receives a floppy disk and reads data from said floppy disk and writes data to said floppy disk, said floppy disk drive arranged adjacent to and co-planar with said hard disk drive;

a power supply that provides electrical power to said system hardware, said power supply horizontally aligned and co-planar with said hard disk drive and said floppy disk drive;

a mother board that receives electrical power from said power supply, said mother board having electrical components that control the operation of said system hardware including said hard disk drive and said floppy disk drive;

at least one optional expansion board that includes electrical components that control the operation of particular functions of said system hardware, said optional expansion board oriented directly above and parallel to said mother board in a stack formation, said stack formation co-planar with said hard disk drive, said floppy disk drive and said power supply; and a daughter board having electrical components that control the operation of additional functions of said system hardware said electrical components mounted on a component surface of said daughter board, said daughter board further having a connector on said component surface, said daughter board mounted to said mother board via said connector in an inverted orientation such that said component surface of said daughter board is parallel to and faces said mother board.

2. A compact computer system unit as defined in claim 1, further including a port connector positioned so that it is offset from said mother board at an offset distance, and wherein said daughter board is mounted a predetermined distance above said mother board, said predetermined distance being twice the offset distance of said port connector, said predetermined distance selected so that said port connector can be mounted to either said mother board or said daughter board and be positioned at said offset distance from said mother board.

3. A compact computer system unit as defined in claim 1, wherein said system hardware further includes a bus expansion card interposed between said mother board and said optional expansion board to electrically connect said optional expansion board to said mother board, said bus expansion card positioned with respect to said mother board and said optional expansion board so that said optional expansion board is positioned in parallel with said mother board to facilitate said stack formation.

4. A compact computer system unit as defined in claim 4, wherein said bus expansion card is mounted so that it is oriented such that it has a perpendicular orientation with respect to said mother board.

5. A compact computer system unit as defined in claim 4, wherein said bus expansion card includes expansion connectors, said expansion connectors connecting directly to said optional expansion board so that said optional expansion board is oriented perpendicular to said bus expansion card and parallel to said mother board.

6. A compact computer system unit as defined in claim 4, further including two spaced brackets mounted directly to said mother board to support said bus expansion card in said perpendicular orientation with respect to said mother board.

7. A compact computer system unit as defined in claim 1, wherein said system hardware further comprises a floppy disk controller card that includes electrical components that control the operation of said floppy disk drive, said floppy disk controller card plugged directly onto said mother board such that said mother board and said floppy disk controller card are co-planar.

8. A compact computer system unit as defined in claim 7, wherein said mother board has an upper surface and wherein said floppy controller card has a connector, said mother board further including a right angle wafer connector mounted on said upper surface, said floppy controller card connector being plugged onto said right angle wafer connector.

9. A compact computer system unit as defined in claim 1, wherein said compact computer system unit has a base and a cover, said base having longitudinal and lateral ribs extending orthogonally along the entire width and length of said base to provide support to said system hardware.

10. A compact computer system unit as defined in claim 9, wherein at least one of said ribs extends upwardly from said base and includes a projection, said projection supporting said mother board in a fixed position with respect to said base and preventing deflection of said mother board when force is applied to said mother board.

11. A compact computer system unit as defined in claim 9, wherein at least one of said longitudinal ribs includes two spaced projections, said spaced projections supporting said bus expansion card rigidly in place.

12. A compact computer system unit utilizing closely integrated system hardware, comprising:

a mother board that includes electrical components that control the operation of said system hardware, a floppy disk drive that receives floppy disks and reads data from and writes data to said floppy disks, a floppy controller card having electrical components that control the operation of said floppy disk drive in response to commands from said electrical components on said mother board, said floppy controller card plugged directly onto said mother board, said floppy controller card and said mother board positioned with respect to each other in a co-planar arrangement to reduce the vertical profile of said compact computer system unit.

13. A compact computer system unit as defined in claim 12, further including a right angle connector mounted on said mother board, said floppy controller card including a floppy connector plugged directly onto said right angle wafer connector.

14. A compact computer system unit utilizing closely integrated system hardware, comprising:

an enclosure including a base;

a mother board that includes electrical components that control the operation of said system hardware, said mother board mounted parallel to said base;

at least one optional expansion board electrically connected to said mother board, said optional expansion board including electrical components that control the operation of particular functions of said system hardware, said expansion board oriented directly above said mother board;

a bus expansion card that includes electrical interconnection lines thereon, said bus expansion card mounted perpendicular to said mother board and affixed by screws through said mother board to said base so that stress applied to said bus expansion card is communicated to said base generally at the location where the screws connect to said base, said bus expansion card electrically interconnecting said optional expansion board and said mother board, said bus expansion card further supporting said optional expansion board so that said optional expansion board lies in a plane parallel to said mother board.

15. A compact computer system unit as defined in claim 14, wherein said mother board includes two spaced brackets mounted on a surface thereof, said brackets positioned to rigidly support said bus expansion card in a fixed position with respect to said mother board, at least one of said brackets connected to said base via said screws.

16. A compact computer system unit with system hardware closely integrated to reduce the vertical profile, comprising:
   an external enclosure that encloses said system hardware, said external enclosure having at least one aperture formed therein;
   a mother board that includes electrical components that control the operation of said system hardware;
   a port connector aligned with said aperture in said external enclosure, said port connector providing electrical interconnections to and from said system hardware within said enclosure, said port connector positioned so that it is offset from said mother board by a first predetermined distance;
   a daughter board that includes electrical components that control the operation of particular functions of said system hardware, said electrical components mounted on a component surface of said daughter board, said daughter board having a connector on said component surface, said daughter board physically and electrically connected to said mother board via said connector so that said daughter board is positioned parallel to said mother board in an inverted orientation such that said component surface of said daughter board faces said mother board, said daughter board positioned a second predetermined distance above said mother board, said second predetermined distance being twice the first predetermined distance of the offset of said port connector so that said port connector is offset from said daughter board by said first predetermined distance so that said port connector can be mounted to and electrically connected to either said mother board or said daughter board and aligned with said aperture in said external enclosure.

17. A compact system as defined in claim 16, wherein said daughter board is an EGA monitor card that controls the operation of a video display device.

* * * * *